(12) United States Patent
Feng

(10) Patent No.: US 12,167,552 B2
(45) Date of Patent: *Dec. 10, 2024

(54) FLEXIBLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Zikang Feng, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/498,419

(22) Filed: Oct. 31, 2023

(65) Prior Publication Data

US 2024/0064916 A1 Feb. 22, 2024

Related U.S. Application Data

(63) Continuation of application No. 17/266,381, filed as application No. PCT/CN2020/130555 on Nov. 20, 2020, now Pat. No. 11,849,549.

(30) Foreign Application Priority Data

May 26, 2020 (CN) .......................... 202010456497.3

(51) Int. Cl.
*H05K 5/02* (2006.01)
*H05K 5/00* (2006.01)

(52) U.S. Cl.
CPC ......... *H05K 5/0217* (2013.01); *H05K 5/0018* (2022.08)

(58) Field of Classification Search
CPC .......................... H05K 5/0017; H05K 5/0217
(Continued)

(56) References Cited

U.S. PATENT DOCUMENTS 11,849,549 B2 * 12/2023 Feng ....................... G09F 9/301
2012/0314400 A1  12/2012 Bohn et al.
2018/0103552 A1  4/2018 Seo et al.

FOREIGN PATENT DOCUMENTS

CN   101395557 A   3/2009
CN   203845159 U   9/2014
(Continued)

OTHER PUBLICATIONS

International Search Report in International application No. PCT/CN2020/130555, mailed on Mar. 2, 2021.
(Continued)

*Primary Examiner* — Hung S. Bui

(57) ABSTRACT

Disclosed is a flexible display device, which includes a flexible display screen; a housing configured to accommodate the flexible display screen, the housing including a first housing and a second housing slidably connected to each other; and a packaging member disposed on at least one first side plate of the second housing, the packaging member including a first packaging portion and a second packaging portion connected to each other. A notch is formed at an intersection of an outer wall and a top surface of the first side plate, the first packaging portion is disposed in the notch, and the second packaging portion is disposed on the top surface of the first side plate.

17 Claims, 20 Drawing Sheets

(58) Field of Classification Search
USPC .................................... 361/807, 809, 810
See application file for complete search history.

(56) References Cited

FOREIGN PATENT DOCUMENTS

| | | |
|---|---|---|
| CN | 105489628 A | 4/2016 |
| CN | 107067973 A | 8/2017 |
| CN | 209046686 U | 6/2019 |
| CN | 110033707 A | 7/2019 |
| CN | 110047385 A | 7/2019 |
| CN | 110491289 A | 11/2019 |
| CN | 110706600 A | 1/2020 |
| CN | 210123987 U | 3/2020 |
| CN | 111508372 A | 8/2020 |
| CN | 212010178 U | 11/2020 |
| JP | 0922000 A | 1/1997 |
| JP | H09322277 A | 12/1997 |
| KR | 20190062107 A | 6/2019 |

OTHER PUBLICATIONS

Written Opinion of the International Search Authority in International application No. PCT/CN2020/130555, mailed on Mar. 2, 2021.
Chinese Office Action issued in corresponding Chinese Patent Application No. 202010456497.3 dated Apr. 17, 2024, pp. 1-9.

\* cited by examiner

FLEXIBLE DISPLAY DEVICE

CROSS-REFERENCE TO RELATED APPLICATIONS

This application is a continuation application of U.S. application Ser. No. 17/266,381, filed on Feb. 5, 2021, now U.S. Pub. No. 20220361347A1, which is a US national phase application based upon an International Application No. PCT/CN2020/130555, filed on Nov. 20, 2020, which claims priority to Chinese Patent Application No. 202010456497.3, filed on May 26, 2020. The entire disclosures of the above applications are incorporated herein by reference.

FIELD OF INVENTION

The present application is related to the field of display technology, and specifically, to a flexible display device.

BACKGROUND OF INVENTION

Currently, flexible display devices mostly use two relatively slidable housings to realize a large-screen and a small-screen display of a flexible display screen. However, when the flexible display devices are retracted and pulled out of their housings, dust and other particles can easily intrude into bottoms of the flexible display screens, causing damage to the flexible display screens.

Therefore, a technical problem that dust is easy to intrude into the current flexible display devices needs to be improved.

SUMMARY OF INVENTION

The present application provides a flexible display device to alleviate a technical problem that dust is easy to intrude into a current flexible display device.

In order to solve the above problem, the present application provides technical solutions as follows.

A flexible display device provided by the present application includes:
- a housing including a first housing and a second housing, which are relatively slidably arranged, wherein the first housing includes a first support member, and the second housing includes a second support member;
- a flexible display screen, wherein a first end of the flexible display screen is connected to the first support member;
- a stretching mechanism disposed in the housing, wherein a second end of the flexible display screen bypasses the second support member and is connected to the stretching mechanism; and
- a packaging member disposed on at least one first side plate of the second housing, wherein a first packaging surface of the packaging member covers at least a portion of an edge of the flexible display screen.

When the flexible display screen is in a first state, the first housing and the second housing slide in directions away from each other, and the stretching mechanism pulls at least a portion of the flexible display screen out of the housing. When the flexible display screen is in a second state, the first housing and the second housing slide in directions approaching each other, and the stretching mechanism retracts at least a portion of the flexible display screen into the housing.

In the flexible display device of the present application, the packaging member includes a first packaging portion and a second packaging portion, which are connected to each other. The first packaging portion is disposed on an outer wall of the first side plate. The second packaging portion is disposed on a top surface of the first side plate through the first packaging surface.

In the flexible display device of the present application, a notch is defined at an intersection of the outer wall and the top surface of the first side plate. The first packaging portion is disposed in the notch.

In the flexible display device of the present application, a thickness of the first packaging portion is equal to a depth of the notch.

In the flexible display device of the present application, the packaging member and the first side plate are formed separately.

In the flexible display device of the present application, a length of the packaging member is greater than or equal to a length of the second support member.

In the flexible display device of the present application, a second side plate of the first housing includes a side plate body and a first extension portion. The side plate body is parallel to the first side plate. The first extension portion covers the packaging member. The packaging member includes a second packaging surface away from a top surface of the first side plate. A first extension surface of the first extension portion is in contact with the second packaging surface.

In the flexible display device of the present application, of the first extension surface and the second packaging surface, one is formed with at least one protrusion, and the other one is defined with at least one groove, which has a same number as the protrusion. The protrusion and the groove fit each other.

In the flexible display device of the present application, a shape of the protrusion includes at least one of a semicircle, a triangle, or a rectangle.

In the flexible display device of the present application, a first blocking member is further provided between the first extension surface and the second packaging surface. The first blocking member includes a brush or a foam.

In the flexible display device of the present application, the second side plate further includes a second extension portion. The second extension portion is connected to and perpendicular to the first extension portion. The side plate body, the first extension portion, and the second extension portion form an accommodation cavity. The packaging member is embedded in the accommodation cavity.

In the flexible display device of the present application, the second extension portion includes a second extension surface adjacent to an upper surface the flexible display screen. A distance between the second extension surface and the upper surface of the flexible display screen is less than or equal to 0.5 millimeters.

In the flexible display device of the present application, the second extension portion includes a second extension surface adjacent to an upper surface the flexible display screen. A second blocking member is further provided between the second extension surface and the upper surface of the flexible display screen. The second blocking member includes a brush or a foam.

In the flexible display device of the present application, the first housing includes a first bottom plate, and the second housing includes a second bottom plate. A distance between a bottom surface of the first bottom plate and a bottom surface of the second bottom plate is less than 1.5 millimeters.

In the flexible display device of the present application, the first housing includes a first bottom plate, and the second housing includes a second bottom plate. A distance between a bottom surface of the first bottom plate and a bottom surface of the second bottom plate is less than 0.5 millimeters.

In the flexible display device of the present application, inner walls of two first side plates arranged oppositely in the second housing are defined with sliding grooves. Two sides of the first support member are movably disposed in the sliding grooves.

In the flexible display device of the present application, of the first support member and the second support member, a surface of one is defined with a plurality of grooves arranged at intervals, a surface of the other one is provided with a plurality of comb teeth arranged at intervals. Each of the plurality of comb teeth is correspondingly embedded in each of the plurality of grooves.

In the flexible display device of the present application, a cross-section of each of the plurality of grooves includes an inverted trapezoid, and a cross-section of each of the plurality of comb teeth includes a regular trapezoid.

In the flexible display device of the present application, the flexible display device further includes a guide member disposed in the housing. A second end of the flexible display screen bypasses the guide member and is connected to the stretching mechanism.

In the flexible display device of the present application, the guide member includes a roller. Inner walls of two first side plates arranged oppositely in the second housing or two end surfaces of the roller are provided with a circular protrusion, another one is defined with a circular groove. The circular protrusion is embedded in the circular groove.

Beneficial effects of the present application are as follows. The flexible display device provided by the present application includes the housing, the flexible display screen, the stretching mechanism, and the packaging member. The housing includes the first housing and the second housing, which are relatively slidably arranged. The first housing includes the first support member. The second housing includes the second support member. The first end of the flexible display screen is connected to the first support member. The stretching mechanism is disposed in the housing. The second end of the flexible display screen bypasses the second support member and is connected to the stretching mechanism. The packaging member is disposed on at least one first side plate of the second housing. The first packaging surface of the packaging member covers at least a portion of the edge of the flexible display screen. When the flexible display screen is in the first state, the first housing and the second housing slide in directions away from each other, and the stretching mechanism pulls at least a portion of the flexible display screen out of the housing. When the flexible display screen is in the second state, the first housing and the second housing slide in directions approaching each other, and the stretching mechanism retracts at least a portion of the flexible display screen into the housing. In the present application, when the flexible display screen is pulled out and retracted into the housing, the packaging member packages a gap between the second support member and the flexible display screen, which prevents the edge of the flexible display screen from being lifted or prevents dust particles from intruding into a bottom of the flexible display screen, thereby extending a lifespan of the flexible display device.

DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF PREFERRED EMBODIMENTS

Figure 1:
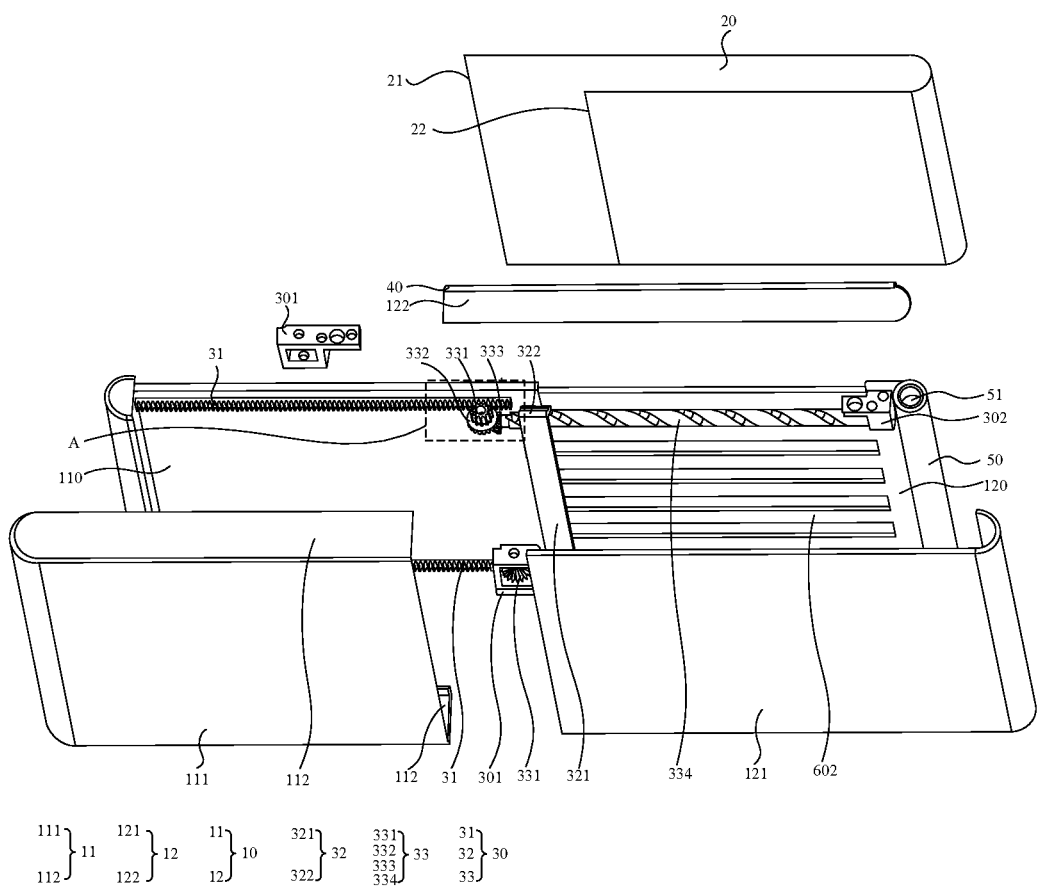
FIG. 1 is an exploded schematic diagram of a flexible display device provided by an embodiment of the present application.

Examples are described below with reference to the appended drawings, and the drawings illustrate particular embodiments in which the present application may be practiced. Directional terms mentioned in the present application, such as upper, lower, front, rear, left, right, in, out, side, etc., only refer to directions in the accompanying drawings. Thus, the adoption of directional terms is used to describe and understand the present application, but not to limit the present application. In the drawings, units of similar structures are using the same numeral to represent.

The present application provides a flexible display device to alleviate a technical problem that dust is easy to intrude into a current flexible display device.

Figure 4:
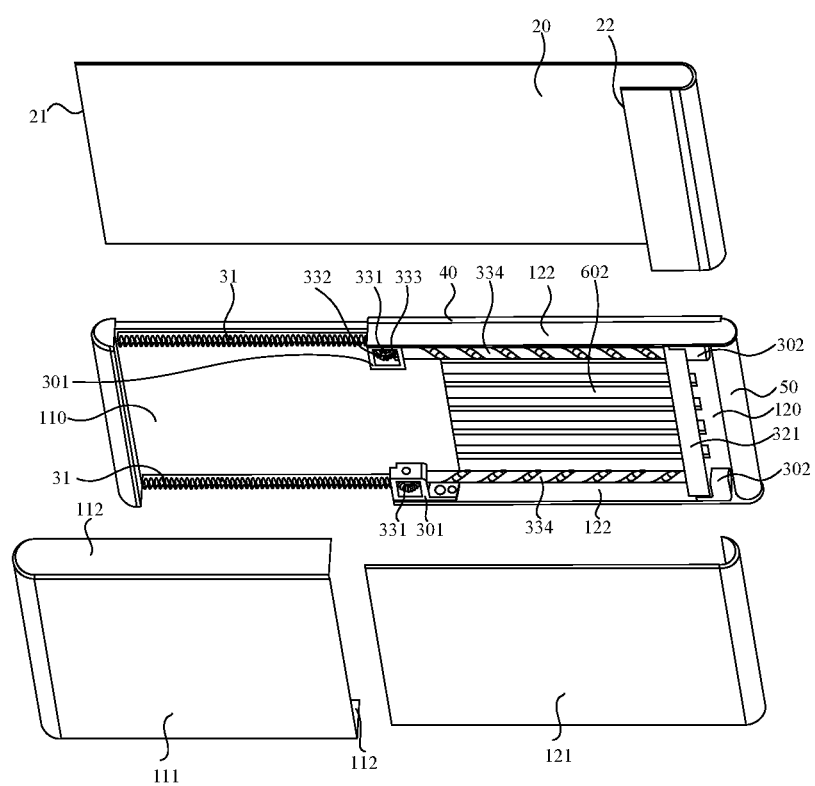
FIG. 4 is a first exploded schematic diagram of the flexible display device provided by an embodiment of the present application in a first state.
Figure 5:
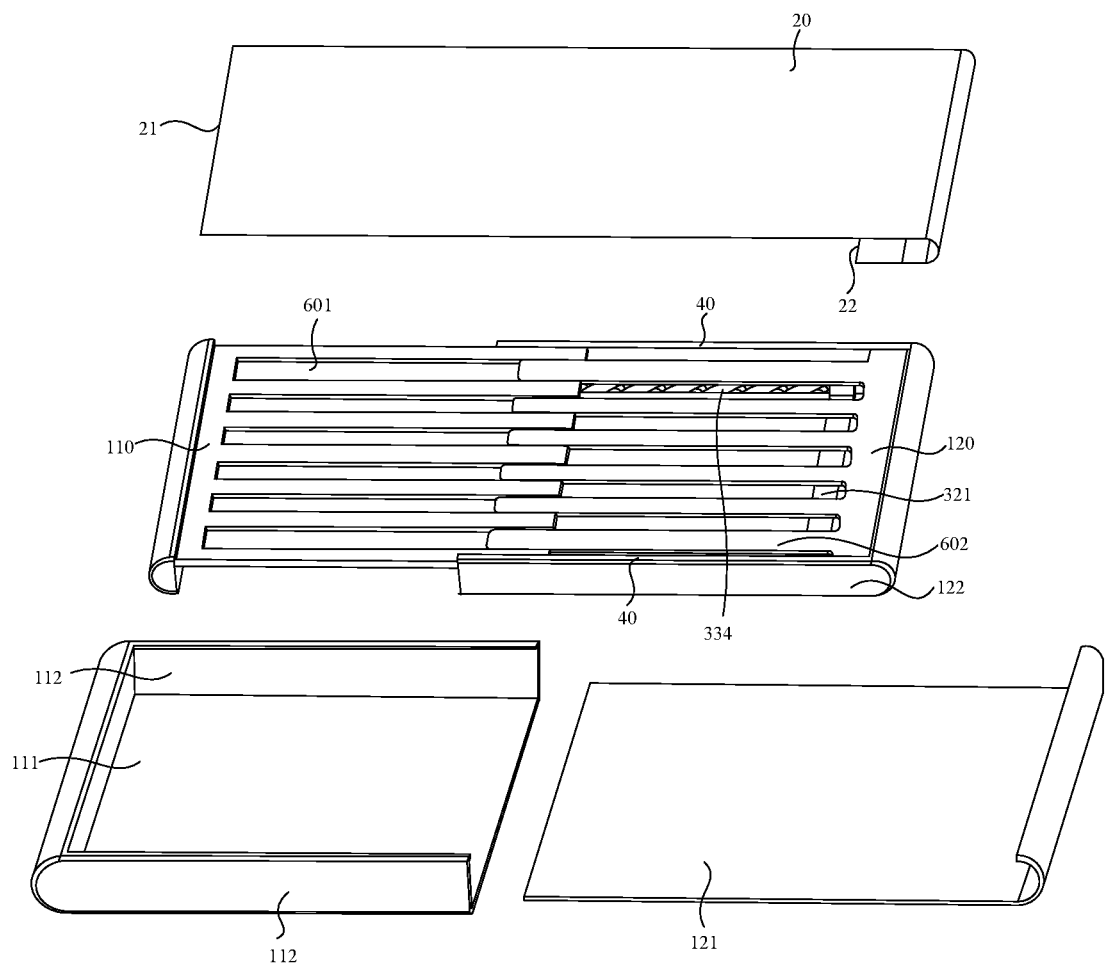
FIG. 5 is a second exploded schematic diagram of the flexible display device provided by an embodiment of the present application in the first state.
Figure 6:
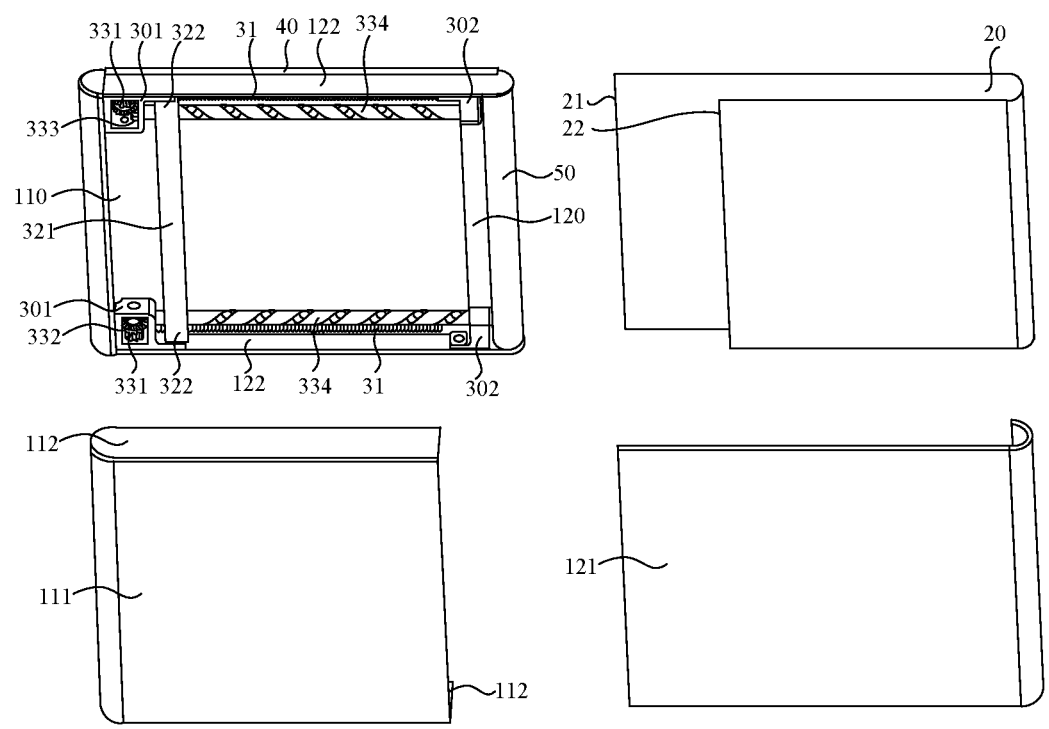
FIG. 6 is a first exploded schematic diagram of the flexible display device provided by an embodiment of the present application in a second state.
Figure 7:
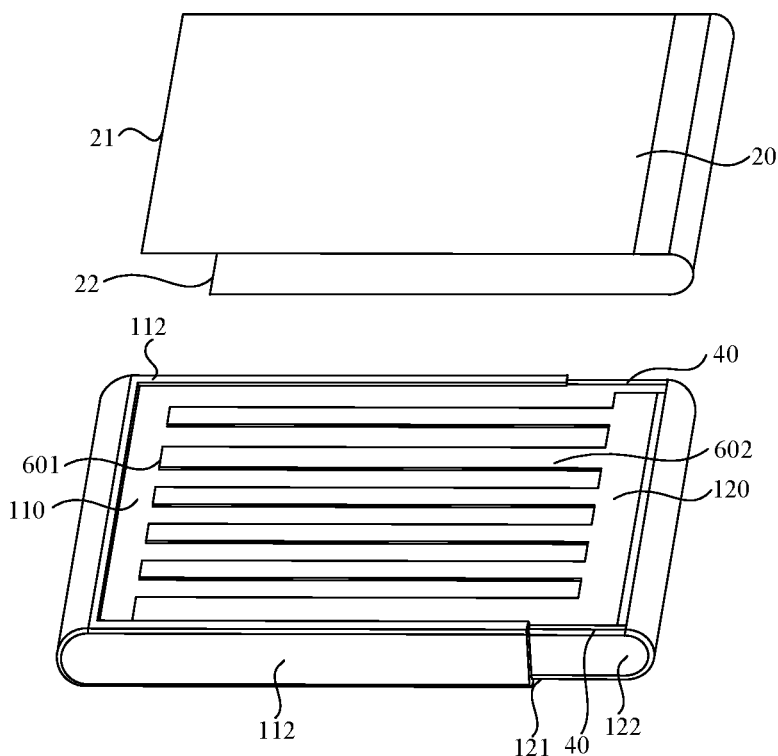
FIG. 7 is a second exploded schematic diagram of the flexible display device provided by an embodiment of the present application in the second state.

FIG. 1 is an exploded schematic diagram of a flexible display device provided by an embodiment of the present application. FIGS. 4 and 5 are exploded schematic diagram of the flexible display device provided by an embodiment of the present application in a first state. FIGS. 6 and 7 are exploded schematic diagram of the flexible display device provided by an embodiment of the present application in a second state. With reference to FIGS. 1, 4, 5, 6, and 7, the flexible display device provided by the present application includes a housing 10, a flexible display screen 20, stretching mechanism 30, and packaging member 40.

The housing 10 includes a first housing 11 and a second housing 12, which are relatively slidably arranged. The first housing 11 includes a first support member 110. The second housing 12 includes a second support member 120.

A first end 21 of the flexible display screen 20 is connected to the first support member 110.

The stretching mechanism 30 is disposed in the housing 10. A second end 22 of the flexible display screen 20 bypasses the second support member 120 and is connected to the stretching mechanism 30.

The packaging member 40 is disposed on at least one first side plate 122 of the second housing 12. A first packaging surface of the packaging member 40 covers at least a portion of an edge of the flexible display screen 20.

When the flexible display screen 20 is in the first state, the first housing 11 and the second housing 12 slide in directions away from each other, and the stretching mechanism 30 pulls at least a portion of the flexible display screen 20 out of the housing 10. When the flexible display screen 20 is in the second state, the first housing 11 and the second housing 12 slide in directions approaching each other, and the stretching mechanism 30 retracts at least a portion of the flexible display screen 20 into the housing 10.

The housing 10 includes the first housing 11 and the second housing 12, which can slide relatively. The first housing 11 includes a first bottom plate 111 and two oppositely disposed second side plates 112. The second housing 12 includes a second bottom plate 121 and two oppositely disposed first side plates 122. The first housing 11 and the second housing 12 can relatively move along a length direction of common sides of the first bottom plate 111 and the second side plates 112. Specifically, the second housing 12 can be embedded in the first housing 11, or the first housing 11 can be embedded in the second housing 12. Both of these arrangements are possible. This embodiment takes the second housing 12 being embedded in the first housing 11 as an example for description. After them being embedded, the first bottom plate 111 is parallel to the second bottom plate 121, and the second side plates 112 are parallel to the first side plates 122.

The first housing 11 includes the first support member 110. The second housing 12 includes the second support member 120. When the first housing 11 and the second housing 12 slide relatively, the first support member 110 and the second support member 120 slide relatively accordingly.

The flexible display screen 20 is usually an organic light-emitting diode (OLED) display having foldable and rollable functions. The first end 21 of the flexible display screen 20 is fixed on an upper surface of the first support member 110. The second end 22 of the flexible display screen 20 bypasses the second support member 120 and is connected to the stretching mechanism 30. The first end 21 can be fixed on the upper surface of the first support member 110. An upper surface of the flexible display screen 20 can display images. The second end 22 is connected to the stretching mechanism 30. The second end 22 is not configured to display images. A region between the first end 21 and the second end 22 can display images. During a winding process, the region can be positioned outside or inside the housing 10 according to a degree of winding.

According to different requirements of users, the flexible display screen 20 can be in different states. The first state refers to a large-screen display state, and the second state refers to a small-screen display state. In the two states, the first end 21 of the flexible display screen 20 is positioned on an outer surface of the flexible display device and can be configured to display images.

Figure 8:
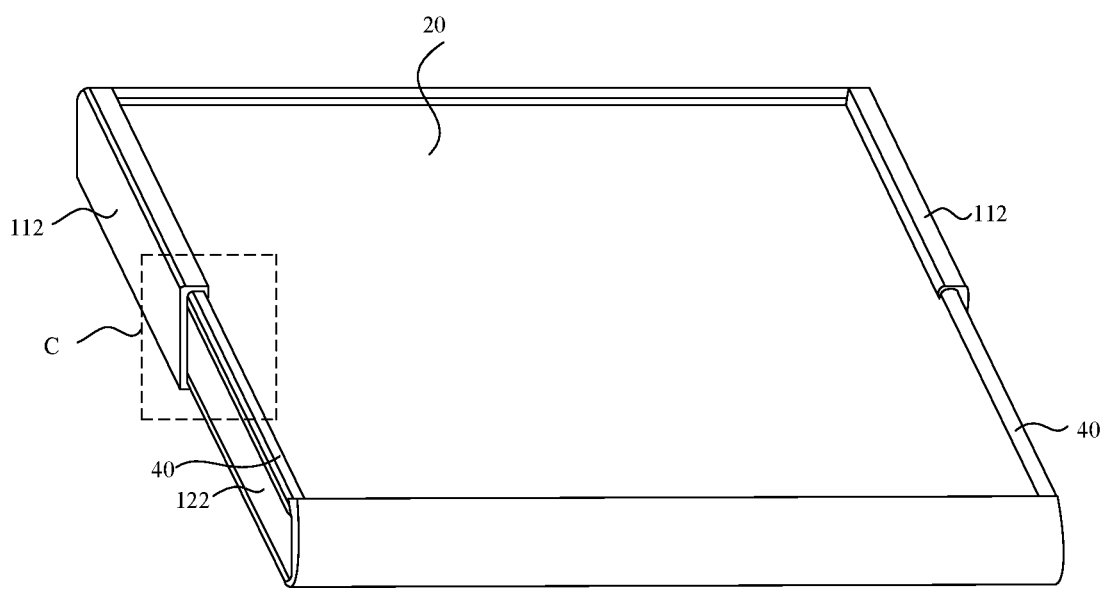
FIG. 8 is a front view of a structural schematic diagram of the flexible display device provided by an embodiment of the present application in the first state.
Figure 9:
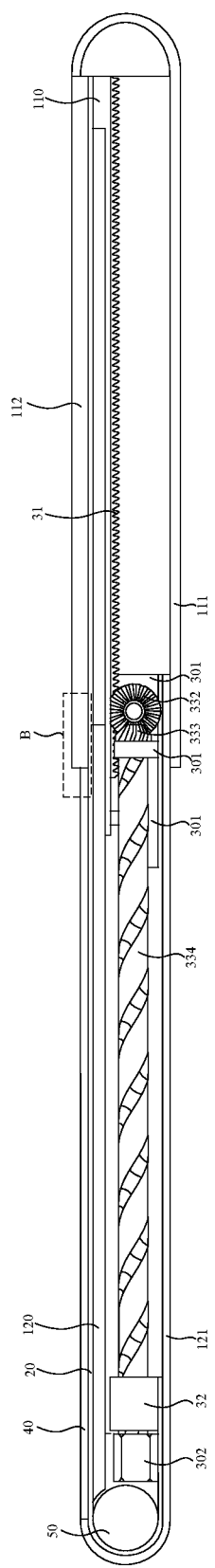
FIG. 9 is a side view of a structural schematic diagram of the flexible display device provided by an embodiment of the present application in the first state.

When the flexible display screen 20 is in the first state, as shown in FIGS. 8 and 9, the first housing 11 and the second housing 12 slide in directions away from each other. The first support member 110 and the second support member 120 also gradually move away from each other. The stretching mechanism 30 pulls at least a portion of the flexible display screen 20 out of the housing 10. The portion can be configured to display images. After the portion is pulled out of the housing 10, the first end 21 and the portion pulled out of the housing 10 display images together. When all of a stretchable region of the flexible display screen 20 is pulled out of the housing 10, the flexible display device can realize a large-screen display. This is when a display area of the flexible display screen 20 is a maximum display area.

Figure 10:
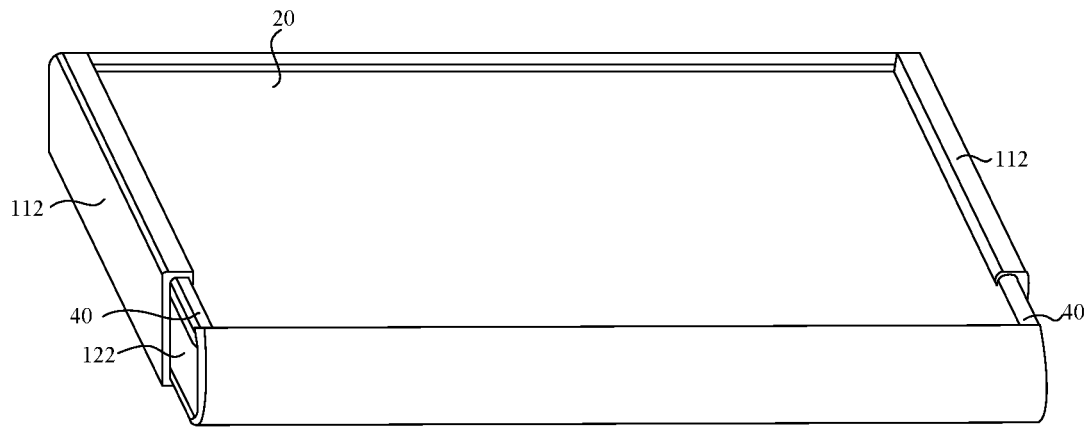
FIG. 10 is a front view of a structural schematic diagram of the flexible display device provided by an embodiment of the present application in the second state.
Figure 11:
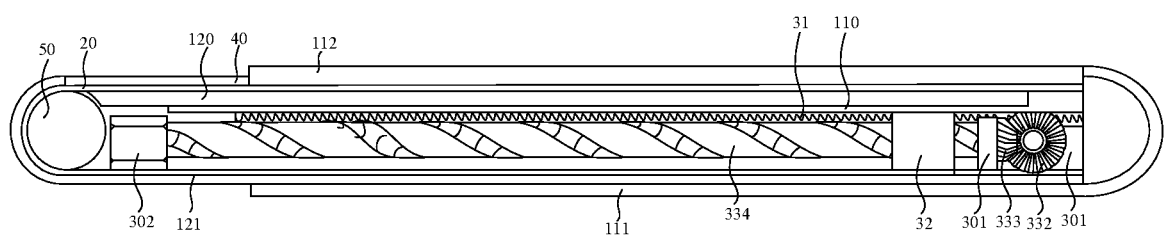
FIG. 11 is a side view of a structural schematic diagram of the flexible display device provided by an embodiment of the present application in the second state.

When the flexible display screen 20 is in the second state, as shown in FIGS. 10 and 11, the first housing 11 and the second housing 12 slide in directions approaching each other. The first support member 110 and the second support member 120 also gradually brought closer to each other. The stretching mechanism 30 retracts at least a portion of the flexible display screen 20 into the housing 10. Meanwhile, the first end 21 and a portion of a region not retracted into the housing 10 display images together. When the stretchable region of the flexible display screen 20 is all retracted into the housing 10, the flexible display device can realize a small-screen display, and a display area of the flexible display screen 20 is an initial display area at this time.

Through the above-mentioned configurations, the flexible display device can be switched between the first state and the second state. When the flexible display screen 20 needs the large-screen display, a required display region is pulled out of the housing 10, so that the display area of the flexible display device is increased, and a displayed content can be more abundant. When the flexible display screen 20 needs the small-screen display, an unrequired display region is retracted into the housing 10, so that the flexible display device has a smaller size and occupies a smaller space, making it convenient to carry. The flexible display device of the present application can flexibly control the display area of the flexible display screen 20, and the housing 10 can protect the internal flexible display screen 20 from damage.

During a relative sliding process of the first housing 11 and the second housing 12, the first end 21 of the flexible display screen 20 is always fixed to the first support member 110, while the second end 22 only bypasses the second support member 120 and is fixed to the stretching mechanism 30. A portion of the flexible display screen 20 on the second support member 120 is not attached to the second support member 120, and the second support member 120 can only provide a support function, so particles such as dust intrude into a gap between the two, causing damage to the flexible display screen 20.

FIGS. 13-34 are respectively a first to a twenty-second cross-sectional schematic diagrams of structures at C in FIG. 8. As shown in FIGS. 8, and 13-34, the packaging member 40 is disposed on at least one first side plate 122. A first packaging surface of the packaging member 40 covers at least a portion of an edge of the flexible display screen 20. During processes of the flexible display screen 20 being pulled out of and retracted into the housing 10, the packaging member 40 covers an edge region of the upper surface of the flexible display screen 20 through the first packaging surface, and plays a role of packaging the gap between the flexible display screen 20 and the second support member 120. This makes it difficult for dust to intrude, thereby protecting the flexible display screen 20 and extending a lifespan of the flexible display device.

The packaging member 40 can be separately or integrally formed with the first side plate 122. When the packaging member 40 is formed separately, the two are fixed by hot melting or glue attachment. When the packaging member 40 is formed integrally, an inner wall of the first side plate 122 is directly formed with protrusions, and the protrusions constitute the packaging member 40.

In an embodiment, a length of the packaging member 40 is greater than or equal to a length of the second support member 120, and the lengths refer to lengths along a long side direction of the first side plate 122. This configuration can make all edges of the portion of the flexible display screen 20 covered by the first packaging surface of the packaging member 40 when the flexible display screen 20 is on the second support member 120, and there is no uncovered portions, so a dustproof effect is better.

The packaging member 40 is disposed on at least one first side plate 122, which means that the packaging member 40 can be disposed on one side only or on two opposite sides. When the first side plates 122 on two opposite sides are provided with the packaging members 40, the dustproof effect is the best. An embodiment of the present application takes two opposite first side plate 122 being provided with the packaging members 40 as an example for description, but only one first side plate 122 provided with the packaging member 40 can also achieve a certain dustproof effect.

In an embodiment, the packaging member 40 includes a first packaging portion 41 and a second packaging portion 42, which are connected to each other. The first packaging portion 41 is disposed on an outer wall of the first side plate 122. The second packaging portion 42 is disposed on a top surface of the first side plate 122 through the first packaging surface. By disposing the packaging member 40 on the first side plate 122, the first packaging portion 41 of the packaging member 40 is fixed on the outer wall of the first side plate 122, and the second packaging portion 42 is fixed on the top surface of the first side plate 122. A gap between the inner wall of the first side plate 122 and a side of the flexible display screen 20 is sealed by the packaging member 40, and the second packaging portion 42 overlaps at least a portion of the edge of the flexible display screen 20, which can limit them in an up-down direction. As such, the packaging member 40 can prevent impurities such as dust from intruding into a bottom of the flexible display screen 20, thereby preventing the flexible display screen 20 from damage when a user presses it, and preventing the flexible display screen 20 and the second support member 120 from separating as a result of faulty operation of the user. Therefore, a sealing performance of the flexible display device is increased, and the lifespan thereof is extended.

In the packaging member 40, the first packaging portion 41 is fixed to the outer wall of the first side plate 122. In order to save space, a notch is defined at an intersection of the outer wall and the top surface of the first side plate 122. A cross-section of the notch is rectangular. The first packaging portion 41 is disposed in the notch. A thickness of the first packaging portion 41 is equal to a depth of the notch, so an outer wall of the first packaging portion 41 can be flush with the outer wall of the first side plate 122. When the second housing 12 is embedded in the first housing 11, there is no need to leave more distance between the first side plate 122 and the second side plate 112 to accommodate the packaging member 40, so that the flexible display device has a smaller overall size and occupies a smaller space.

In an embodiment, as shown in FIGS. 13-22, the second side plate 112 includes a side plate body 1121 and a first extension portion 1122. The side plate body 1121 is parallel to the first side plate 122. The first extension portion 1122 covers the packaging member 40. The packaging member 40 includes a second packaging surface away from the top surface of the first side plate 122. A first extension surface of the first extension portion 1122 is in contact with the second packaging surface. By arranging the second side plate 112 of the first housing 11 as a structure surrounding the packaging member 40, which further packages two opposite sides of the flexible display screen 20 during the sliding process of the second support member 120, the edge of the flexible display screen 20 is prevented from being lifted, or dust particles are prevented from intruding into the bottom of the flexible display screen, resulting in a better packaging effect.

Figure 14:
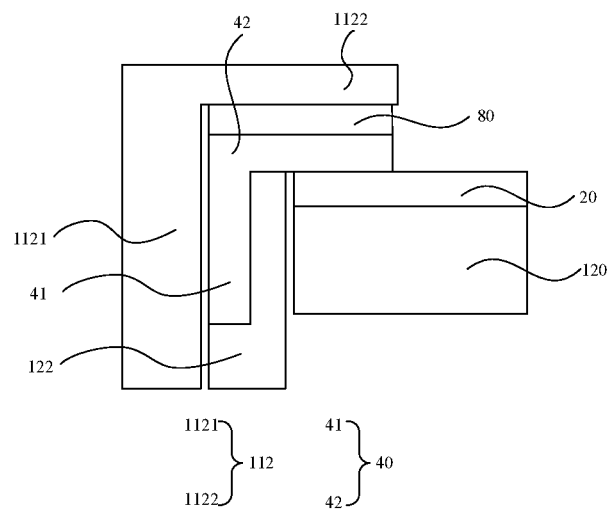
Figure 15:
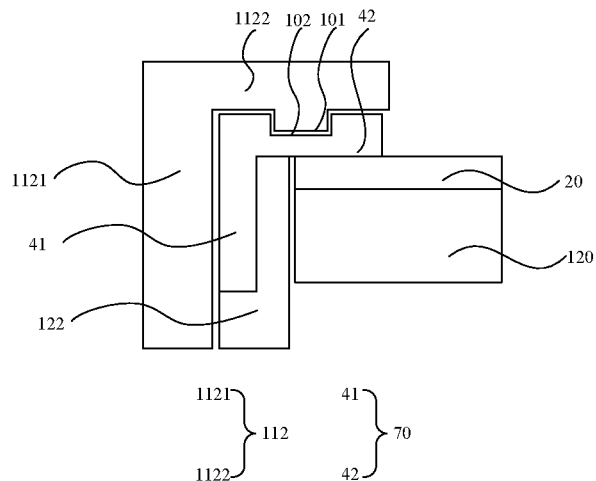
Figure 16:
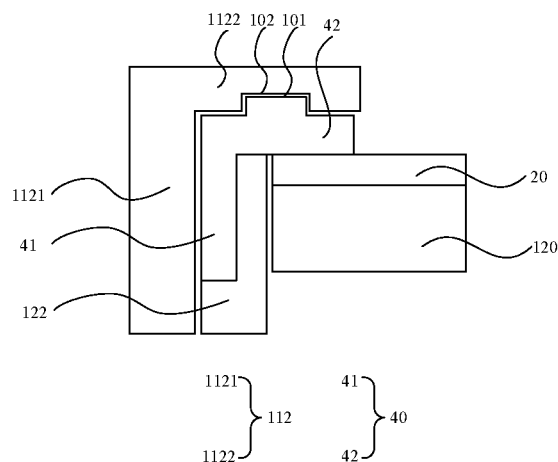
Figure 17:
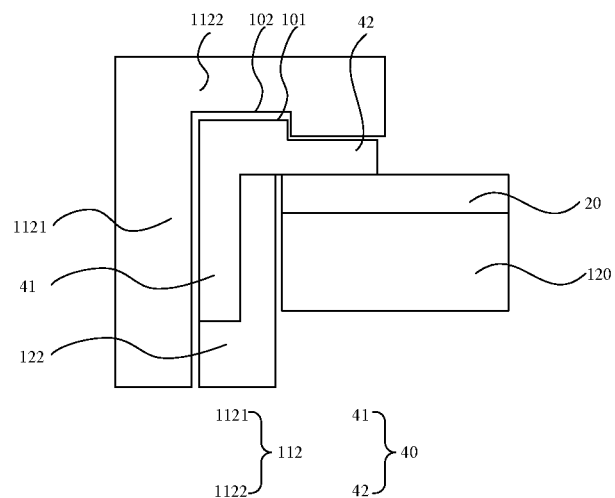
Figure 18:
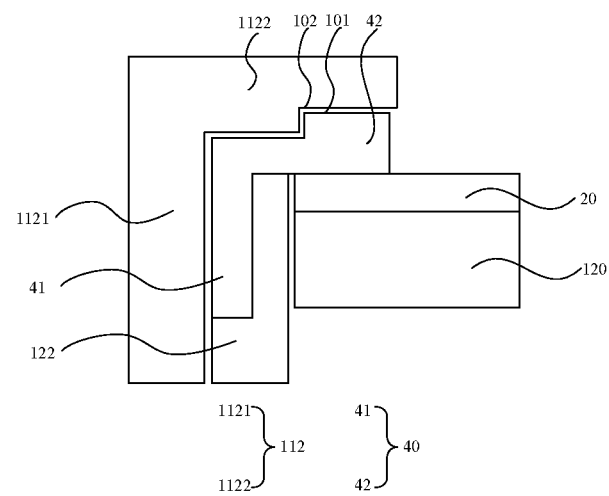
Figure 19:
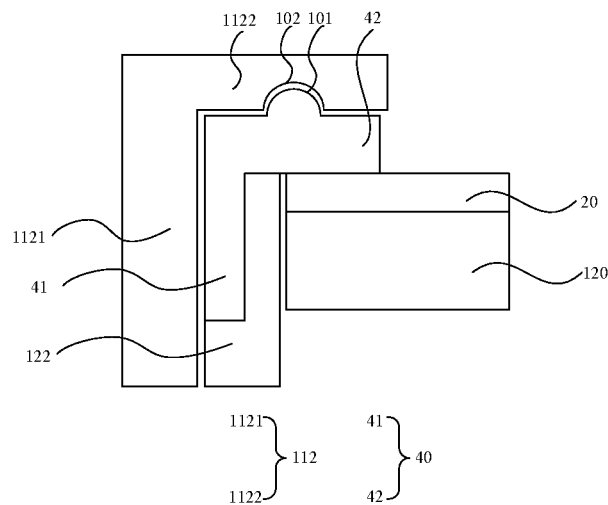
Figure 20:
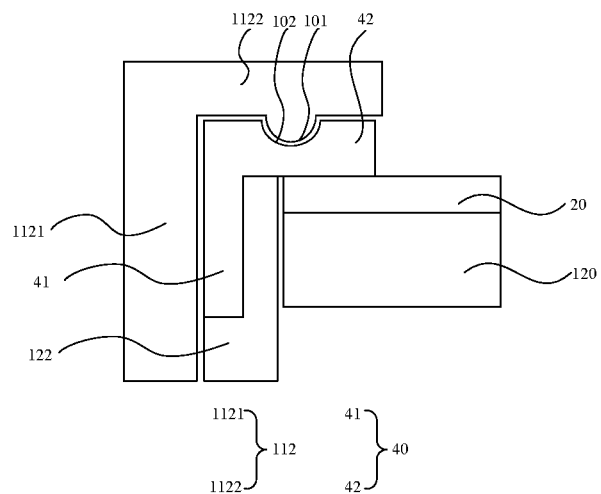
Figure 21:
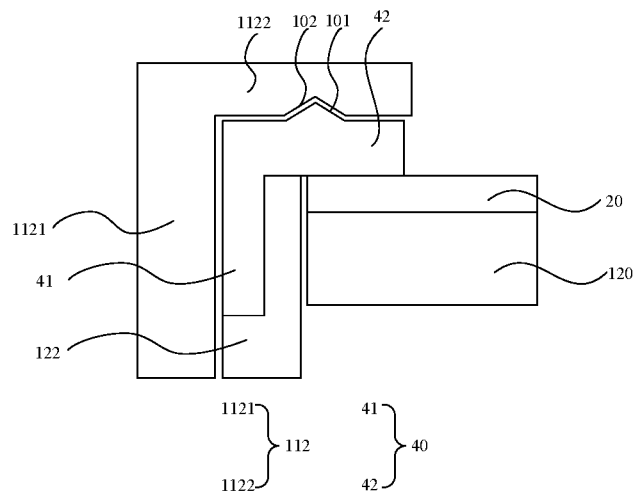
Figure 22:
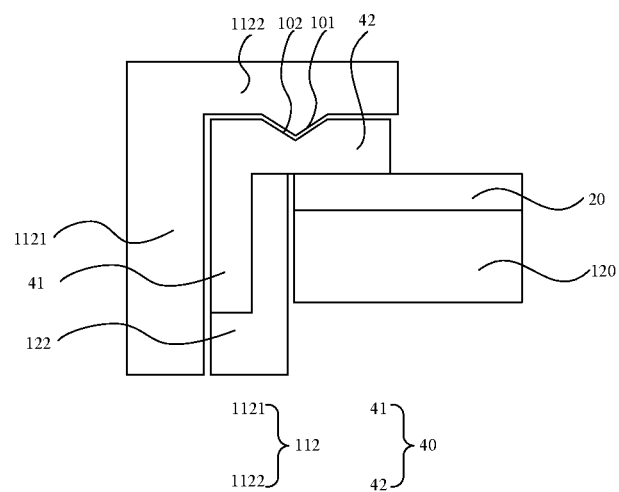
Figure 23:
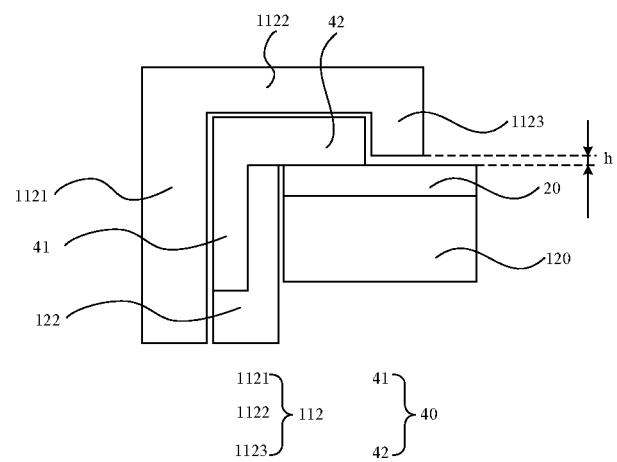

In an embodiment, as shown in FIG. 14, a first blocking member 80 is further provided between the first extension surface and the second packaging surface. The first blocking member 80 includes a soft material with high volumetric shrinkage such as a brush or a foam. A possibility of external dust particles intruding through the gap between the second side plate 112 and the packaging member 40 can be further reduced by disposing the first blocking member 80, thereby increasing the packaging effect.

In an embodiment, as shown in FIGS. 15-22, of the first extension surface and the second packaging surface, one is formed with at least one protrusion 101, and the other one is defined with at least one groove 102, which has a same number as the protrusion 101. The protrusion 101 and the groove 102 fit each other. A shape of the protrusion 101 includes at least one of a semicircle, a triangle, or a rectangle. The packaging member 40 and the second side plate 112 can be integrated more tightly by a way that the protrusion 101 and the groove 102 fit each other. The possibility of external dust particles intruding through the gap between the second side plate 112 and the packaging member 40 can be further reduced, thereby increasing the packaging effect.

In an embodiment, as shown in FIGS. 23-34, in addition to the side plate body 1121 and the first extension portion 1122, the second side plate 112 further includes a second extension portion 1123. The second extension portion 1123 is connected to and perpendicular to the first extension portion 1122. The side plate body 1121, the first extension portion 1122, and the second extension portion 1123 form an accommodation cavity. The packaging member 40 is embedded in the accommodation cavity. A packaging of the packaging member 40 is realized by disposing the second extension portion 1123. Meanwhile, a pressing function of the flexible display screen 20 is increased to make it difficult to be lifted upward. The second side plate 112 and the packaging member 40 fit each other to provide packaging on the edges of two opposite sides of the flexible display screen 20 during the sliding process, resulting in a better packaging effect.

In an embodiment, the second extension portion 1123 includes a second extension surface adjacent to an upper surface the flexible display screen 20. A distance between the second extension surface and the upper surface of the flexible display screen 20 is less than or equal to 0.5 millimeters. The distance can ensure that dust is not easy to intrude.

Figure 24:
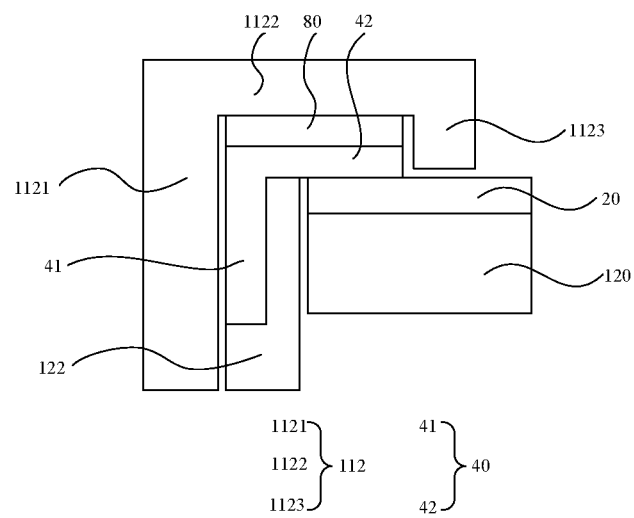

In an embodiment, as shown in FIG. 24, the first blocking member 80 is further provided between the first extension surface of the first extension portion 1122 and the second packaging surface. The first blocking member 80 includes the soft material with high volumetric shrinkage such as the brush or the foam. The possibility of external dust particles intruding through the gap between the second side plate 112 and the packaging member 40 can be further reduced by disposing the first blocking member 80, thereby increasing the packaging effect.

Figure 25:
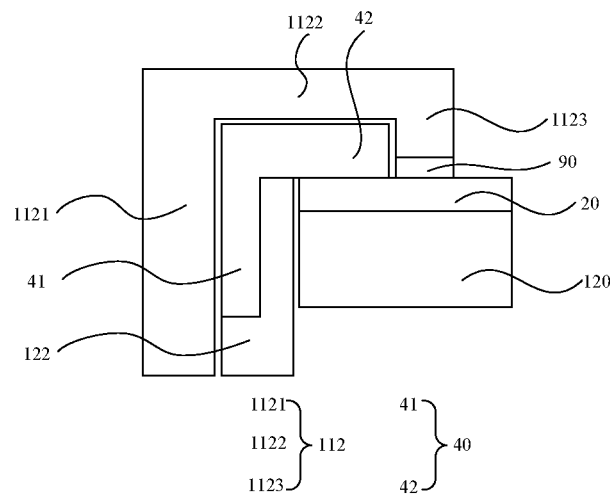

In an embodiment, as shown in FIG. 25, a second blocking member 90 is further provided between the second extension surface of the second extension portion 1123 and the upper surface of the flexible display screen 20. The second blocking member 90 includes the soft material with high volumetric shrinkage such as the brush or the foam. A possibility of external dust particles intruding through the gap between the second side plate 112 and the flexible display screen 20 can be further reduced by disposing the second blocking member 90, thereby increasing the packaging effect.

Figure 26:
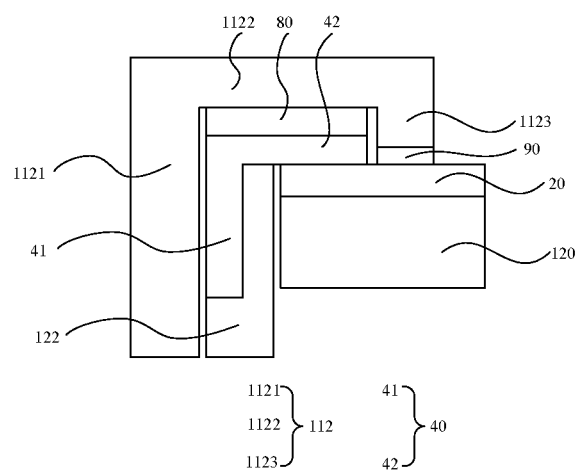
Figure 27:
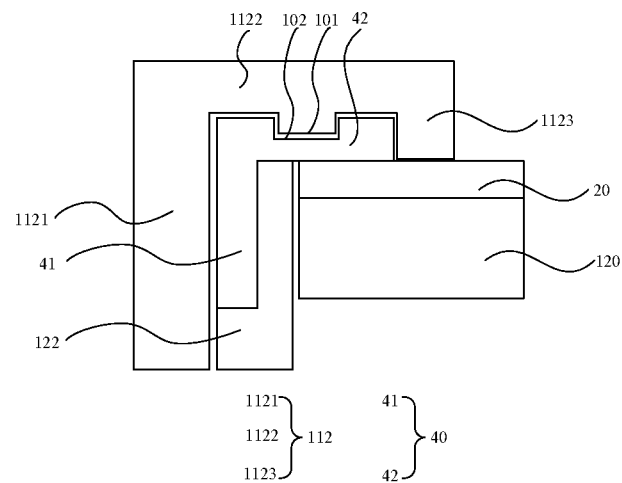
Figure 28:
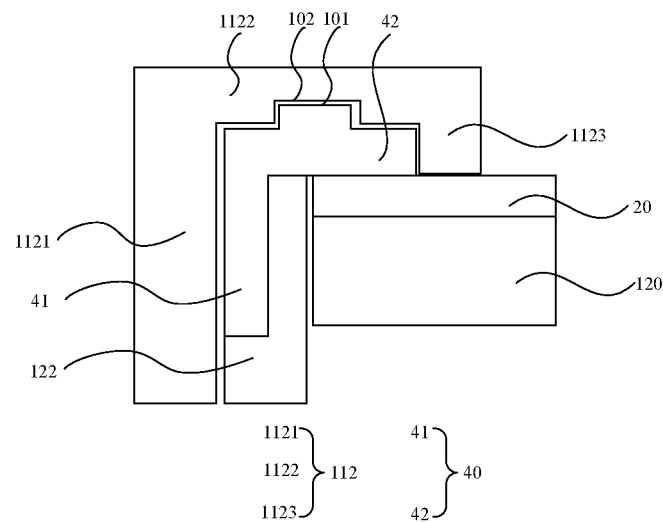
Figure 29:
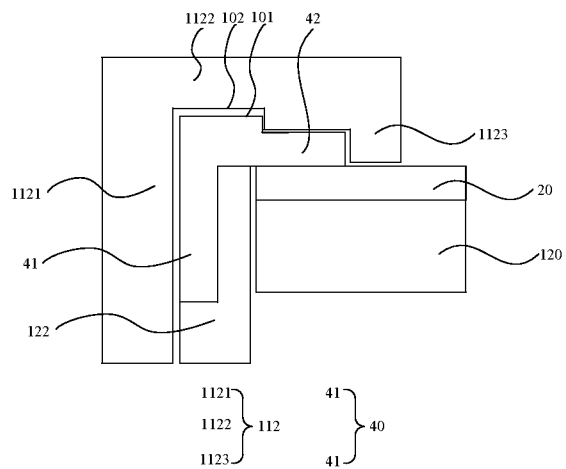
Figure 30:
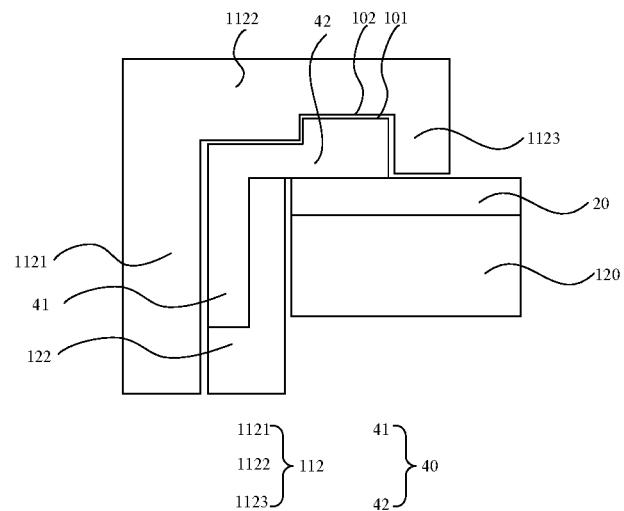
Figure 31:
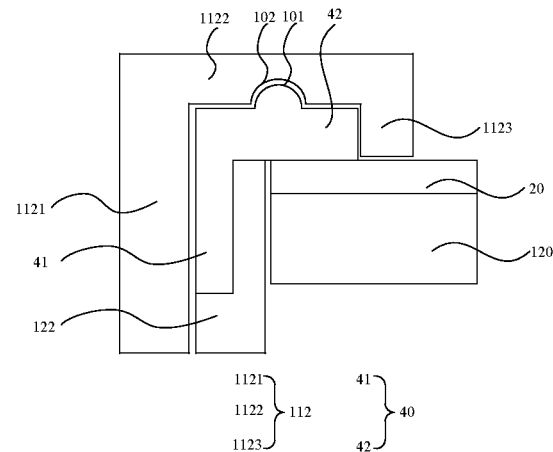
Figure 32:
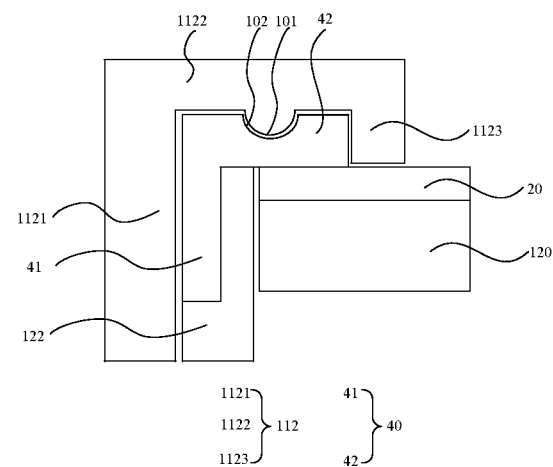
Figure 33:
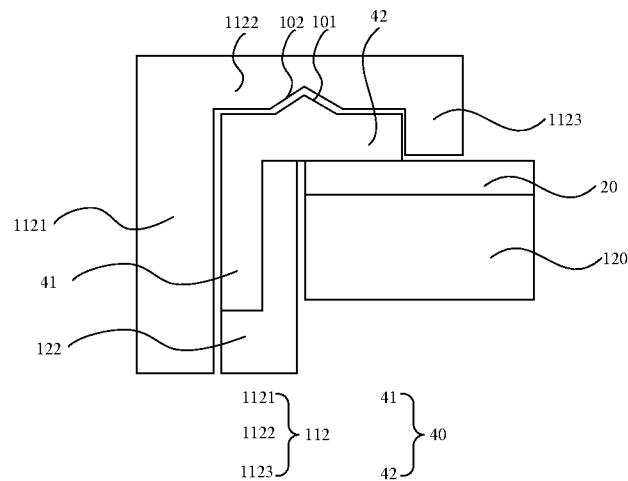
Figure 34:
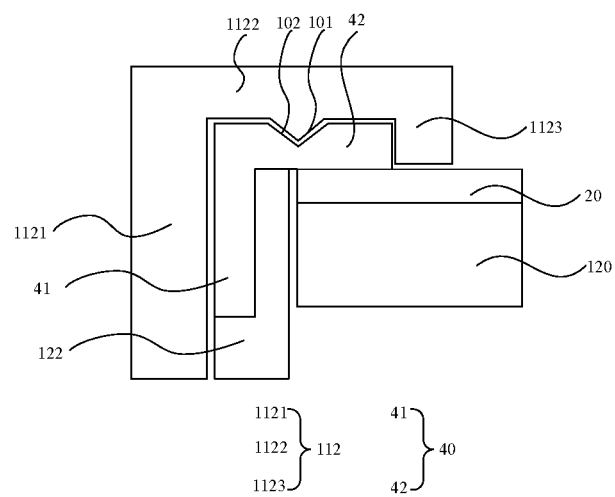

In an embodiment, as shown in FIG. 26, the first blocking member 80 is further provided between the first extension surface of the first extension portion 1122 and the second packaging surface, and the second blocking member 90 is further provided between the second extension surface of the second extension portion 1123 and the upper surface of the flexible display screen 20. The first blocking member 80 and the second blocking member 90 both include the soft material with high volumetric shrinkage such as the brush or the foam. The possibilities of external dust particles intruding through the gap between the second side plate 112 and the packaging member 40 and the gap between the second side plate 112 and the flexible display screen 20 can be further reduced by disposing the first blocking member 80 and the second blocking member 90, thereby increasing the packaging effect.

In an embodiment, as shown in FIGS. 27-34, of the first extension surface and the second packaging surface, one is formed with at least one protrusion 101, and the other one is defined with at least one groove 102, which has a same number as the protrusion 101. The protrusion 101 and the groove 102 fit each other. A shape of the protrusion 101 includes at least one of a semicircle, a triangle, or a rectangle. The packaging member 40 and the second side plate 112 can be integrated more tightly by a way that the protrusion 101 and the groove 102 fit each other. The possibility of external dust particles intruding through the gap between the second side plate 112 and the packaging member 40 can be further reduced, thereby increasing the packaging effect.

In the flexible display device of the present application, because the second housing 12 is embedded in the first housing 11, the first housing 11 and the second housing 12 are interconnected in their thickness directions, and the first housing 11 covers the second bottom plate 121 of the second housing 12 and two first side plates 122, an overlapping region between the second housing 12 and the first housing 11 is increased and decreased through different relative sliding directions of the first housing 11 and the second housing 12 when the first housing 11 is in the sliding process. A distance between a bottom surface of the first bottom plate 111 and a bottom surface of the second bottom plate 112 is less than 1.5 millimeters, so as to ensure an overall pleasing appearance of the flexible display device. A distance between the bottom surface of the first bottom plate 111 and the bottom surface of the second bottom plate 112 is less than or equal to 0.5 millimeters, so as to provide a complete appearance and a dustproof packaging function for a back of the flexible display device.

As shown in FIGS. 1, 4, 5, 6, and 7, the stretching mechanism 30 includes a first stretching member 31, a second stretching member 32, and a transmission assembly 33. The first stretching member 31 is positioned above the second stretching member 32. The first stretching member 31 is fixed to the first support member 110. The transmission assembly 33 is fixed to the second housing 12. The second stretching member 32 and the transmission assembly 33 are movably disposed. When the transmission assembly 33 is in operation, it can drive the first stretching member 31 and the second stretching member 32 to move in the opposite direction along a stretching direction at the same time. The stretching direction is a direction parallel to long sides of the first side plate 121 and the second side plate 112, which refers to a horizontal direction in FIG. 1. Depending on states of the flexible display screen 20, the transmission assembly 33 drives the first stretching member 31 and the second stretching member 32 to move in different directions, the two can be gradually brought closer to each other along the stretching direction, or the two can be gradually moved away along the stretching direction. In addition, because the first stretching member 31 is fixed to the first housing 11, movements of the first housing 11 are driven by the first stretching member 31.

In the second housing 12, two first side plates 122 can be integrally formed with the second bottom plate 121, or they can be formed separately and followed by disposed on the second bottom plate 121. In this embodiment, they are formed separately. Inner walls of the two first side plates 122 are defined with snap grooves, and two opposite sides of the second support member 120 are fixedly installed in the two snap grooves. The second support member 120 and the two first side plates 122 cannot move or rotate relative to each other.

The first end 21 of the flexible display screen 20 is fixed to the first support member 110. The second end 22 bypasses the second support member 120 and is fixed to the second stretching member 32 in the stretching mechanism 30. The transmission assembly 33 controls a relative sliding of the first housing 11 and the second housing 12 by controlling sliding directions of the first stretching member 31 and the second stretching member 32, and the flexible display 20 is controlled to be pulled out of and retracted into the housing 10.

During the processes of the flexible display screen 20 being pulled out of and retracted into the housing 10, the transmission assembly 33 can control the first stretching member 31 and the second stretching member 32 to stop moving at any time, so the flexible display device can be controlled to select any sizes between the initial display area and the maximum display area for display, which is more flexible.

The first support member 110 follows the first stretching member 31 to move together along the stretching direction and drives the flexible display screen 20 to be retracted into and pulled out of the housing 10. In order to make the first support member 110 always move in a same direction as the stretching direction, it is necessary to provide a limit structure on the two first side plates 122.

In an embodiment, the two first side plates 122 are both defined with slots, and two opposite sides of the first support member 110 are movably installed in the slots. Specifically, two opposite sides of the first support member 110 are provided with sliders. The sliders are disposed in the slots and slide back and forth along a length direction of the slots. The slots extend along the stretching direction. In this way, it can be ensured that the flexible display screen 20 outside the housing 10 can be retracted into and pulled out of the housing 10. When the user is viewing images on the flexible display screen 20, the screen will not be tilted, ensuring a viewing effect.

Figure 2:
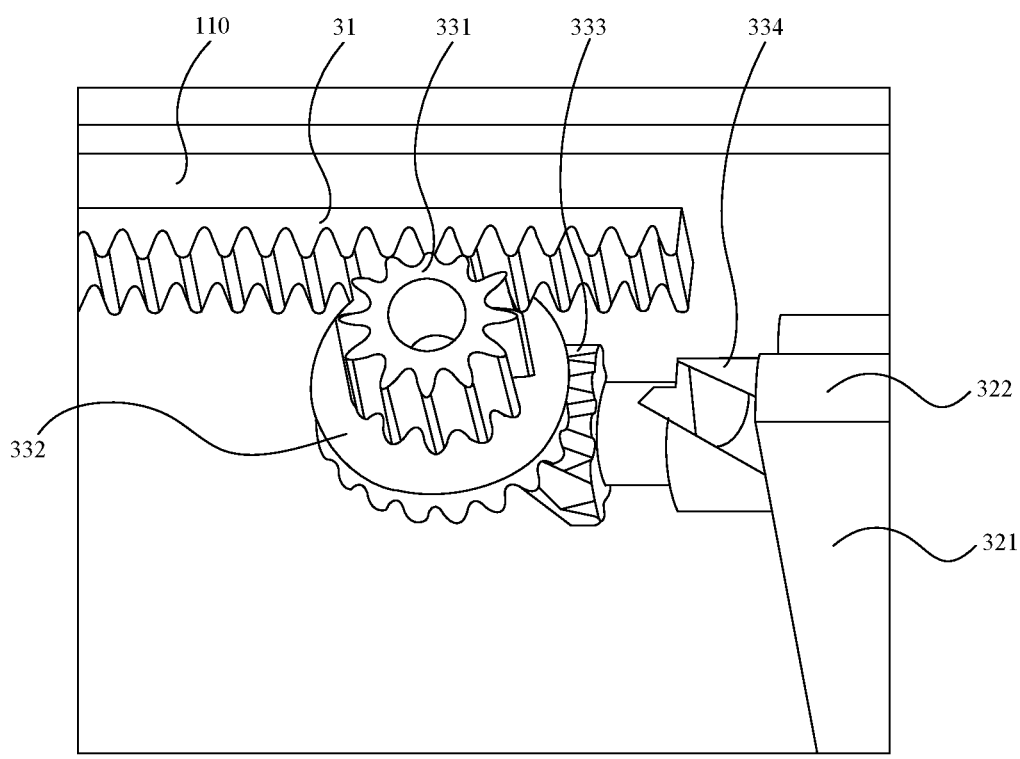
FIG. 2 is an enlarged schematic diagram of a structure at A in FIG. 1.
Figure 3:
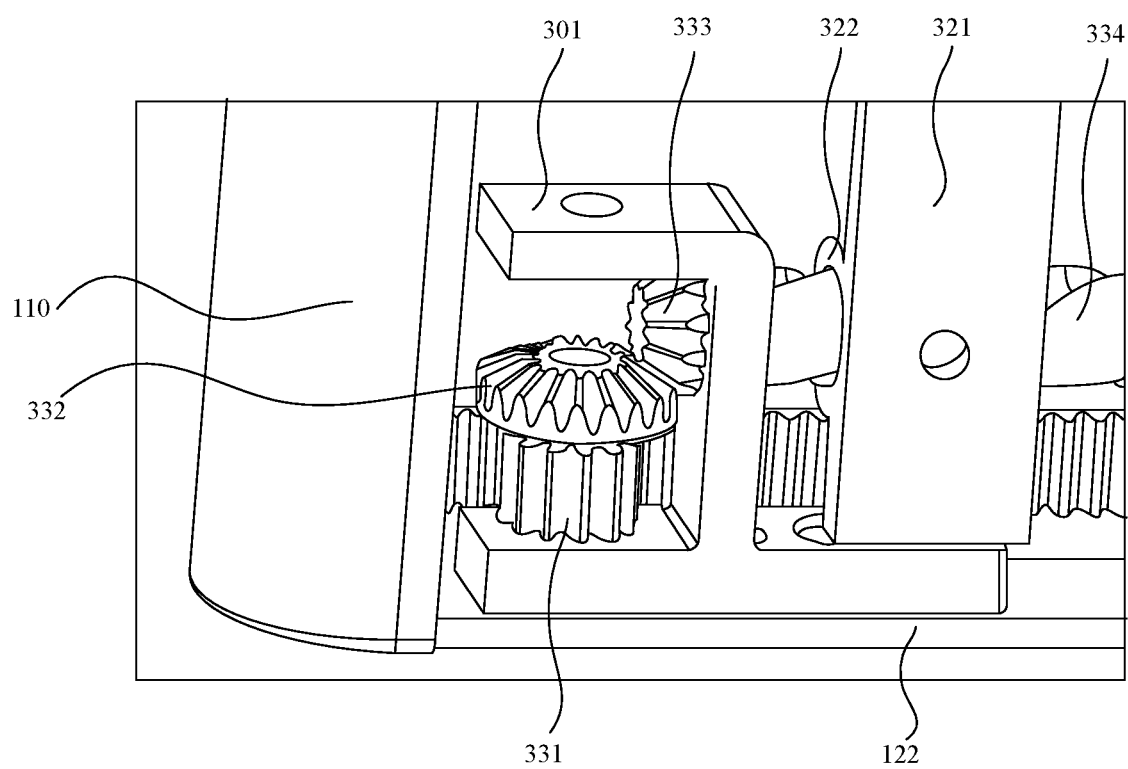
FIG. 3 is a schematic diagram of the structure in FIG. 2 viewed from another angle.

FIG. 2 is an enlarged schematic diagram of a structure at A in FIG. 1. FIG. 3 is a schematic diagram of the structure in FIG. 2 viewed from another angle. With reference to FIGS. 1, 2, and 3, the transmission assembly 30 includes a first transmission assembly and a second transmission assembly disposed on the inner walls of the two first side plates 122. Both the first transmission assembly and the second transmission assembly include a circular gear 331, a first bevel gear 332, a second bevel gear 333, and a screw 334. The first bevel gear 332 is fixed on a side of the circular gear 331 and is coaxial with the circular gear 331, and their rotation direction and rotation speed are the same. The second bevel gear 333 meshes with the first bevel gear 332, which means that the second bevel gear 333 and the first bevel gear 332 have equal modules and form a gear pair. The second bevel gear 333 is fixed on a first end of the screw 334. The screw 334 and the second bevel gear 333 are coaxial, and their rotation direction and rotation speed are the same.

In the first transmission assembly and the second transmission assembly, the circular gear 331 and the second bevel gear 333 are both fixed to the inner wall of the first side plate 122 through a gear bracket 301. A second end of the screw 334 is fixed to the inner wall of the first side plate 122 through a screw bracket 302. The gear bracket 301 supports the circular gear 331, the first bevel gear 332, and the second bevel gear 333, and indirectly provides support for the first end of the screw 334. The circular gear 331, the first bevel gear 332, and the second bevel gear 333 can all rotate freely along their own axes. The screw bracket 302 supports the second end of the screw 334. The screw 334 can also rotate freely along its own axis.

In an embodiment, the first stretching member 31 includes two gear racks fixed on a bottom surface of the first support member 110. The two gear racks are respectively adjacent to the two first side plates 122. Of the two gear racks, one meshes with the circular gear 331 in the first transmission assembly, and the other one meshes with the circular gear 331 in the second transmission assembly, which means that the two racks and the two circular gears 331 respectively form gear pairs.

The second stretching member 32 includes a sliding plate 321 and sleeves 322 disposed at two opposite ends of the sliding plate 321. The sleeves 322 are respectively nested with the screw 334 in the first transmission assembly and the screw 334 in the second transmission assembly. An inner wall of each sleeve 322 are provided with a protrusion (not shown), and the protrusion fits a thread groove on the screw 334.

When the flexible display device is switched between the first state and the second state, a rotation of the circular gear 331 drives the first stretching member 31 and the second stretching member 32 to move, and a power of the circular gear 331 comes from a driving mechanism (not shown) of the flexible display device.

When the flexible display screen 20 is in the first state, the driving mechanism drives the circular gear 331 to rotate in a first direction. The circular gear 331 meshes with the gear rack to drive the first stretching member 31 to move in a direction away from the second stretching member 32. Meanwhile, because the rotation direction and rotation speed of the first bevel gear 332 and the circular gear 331 are the same, the first bevel gear 332 drives the screw 334 to rotate by meshing with the second bevel gear 333. Because the thread groove on the screw 334 fits the groove on the inner wall of the sleeve 322, the protrusion on the inner wall of the sleeve 322 can only slide in the thread groove. Therefore, when the screw 334 rotates, the sliding plate 321 is pulled by the thread groove to slide in an opposite direction of the gear rack sliding, which means that the circular gear 331 drives the second stretching member 32 to move in a direction away from the first stretching member 31.

Similarly, When the flexible display screen 20 is in the second state, the driving mechanism drives the circular gear 331 to rotate in a second direction. The circular gear 331 meshes with the gear rack to drive the first stretching member 31 to move in a direction approaching the second stretching member 32. Because the first bevel gear 332, the second bevel gear 333, and the screw 334 fit each other, the second stretching member 32 is driven to move in a direction approaching the first stretching member 31. The first direction is one of clockwise or counterclockwise, and the second direction is the other one of clockwise or counterclockwise.

The driving mechanism can be a motor or a reducer connected to the circular gear 331. The circular gear 331 is driven by the motor or the reducer, so an entire motion system can be controlled by electrical signals. The user only needs to transmit electrical signals to the motor through buttons to drive the entire motion system to operate, so that the flexible display device of the present application can be switched between two display states of retraction and stretching.

In the flexible display device of the present application, when the transmission assembly 33 drives the first stretching member 31 and the second stretching member 32 to move, moving distances and moving speeds of the first stretching member 31 and the second stretching member 32 are equal. Specifically, the moving distance (speed) of the gear rack and the moving distance (speed) of the sliding plate 321 are always equal in magnitude and opposite in direction by configuring a reference circle diameter d1 of the circular gear 331, a reference circle diameter d2 of the first bevel gear 332, a reference circle diameter d3 of the second bevel gear 333, and a pitch L of the thread groove on the screw 334.

In an embodiment, the above four satisfy an equation: $d2*L=\pi*d1*d3$. Assuming that the moving distance of the gear rack is a, a rotation angle of the circular gear 331 meshing with the gear rack is $\alpha 1$, and the two satisfy $\alpha 1=2a/d1$. Because the first bevel gear 332 and the circular gear 331 are coaxial and fixed together, a rotation angle of the first bevel gear 332 is also $\alpha 1$. The first bevel gear 332 meshes with the second bevel gear 333, and if the rotation angle of the second bevel gear 333 is $\alpha 2$, then $d2*\alpha 1=d3*\alpha 2$, and $\alpha 2=d2*\alpha 1/d3$. Also, the second bevel gear 333 and the screw 334 are coaxial and fixed together, a rotation angle of the screw 334 is also $\alpha 2$. If a pitch of the screw is L, a sliding distance of the sliding plate 321 is b, when the screw 334 rotates one turn, the sliding distance of the sliding plate 321 is also L. Therefore, a distance that the screw 334 pushes the sliding plate 321 to slide satisfies $b=\alpha 2/2/\pi*L$. Because it is necessary to meet a minimum pulling force on the flexible display screen 20 during the sliding process, a=b is configured, and $d2*L=\pi*d1*d3$ is obtained.

If the above equation is satisfied, when the flexible display screen 20 is pulled out of the housing 10, a length of a portion of the flexible display screen 20 pulled out of the housing 10 by the first stretching member 31 is equal to a length of a portion of flexible display screen 20 pushed out of the housing 10 by the second stretching member 32, and speeds of pulling out and pushing out are equal. Therefore, when the flexible display screen 20 is stretched outwards and retracted inward, it will not be greatly dragged, thereby forming a protective effect on the flexible display screen 20 and extending the lifespan of the flexible display screen 20.

In an embodiment, the first stretching member 31 includes a first rack provided on the bottom surface of the first support member 110. The second stretching member 32 includes a second rack provided on a top surface of the second support member 120. The transmission assembly 33 includes a gear and a gear pin penetrating through a center hole of the gear. The gear pin is movably installed in a transmission groove, which can make the gear rotate clockwise or counterclockwise around its own axis. The gear meshes with the first rack and the second rack, which means that modules of the gear, the first rack, and the second rack are all equal. Therefore, the first gear rack and the gear form a gear pair, and the second gear rack and the gear also form a gear pair.

When the flexible display device is switched between the first state and the second state, a rotation of the gear drives the first stretching member 31 and the second stretching member 32 to move, and the power of the gear comes from a driving mechanism of the flexible display device. When the flexible display screen 20 is in the first state, the driving mechanism drives the gear to rotate in the first direction. The gear meshes with the first gear rack to drive the first stretching member 31 to move in the direction away from the second stretching member 32 and meshes with the second gear rack to drive the second stretching member 32 to move in the direction away from the first stretching member 31.

When the flexible display screen 20 is in the second state, the driving mechanism drives the gear to rotate in the second direction. The gear meshes with the first gear rack to drive the first stretching member 31 to move in the direction approaching the second stretching member 32 and meshes with the second gear rack to drive the second stretching member 32 to move in the direction approaching the first stretching member 31. The first direction is one of clockwise or counterclockwise, and the second direction is the other one of clockwise or counterclockwise.

The driving mechanism can be a motor or a reducer connected to the gear. The gear is driven by the motor or the reducer, so the entire motion system can be controlled by electrical signals. The user only needs to transmit electrical signals to the motor through buttons, and can drive the entire motion system to operate, so that the flexible display device of the present application can be switched between two display states of retraction and stretching.

Because the gear meshes with the first gear rack and the second gear rack, the moving distances and the moving speeds of the first stretching member 31 and the second stretching member 32 are always equal in magnitude and opposite in direction. When the flexible display screen 20 is pulled out of the housing 10, a length of a portion of the flexible display screen 20 pulled out of the housing 10 by the first stretching member 31 is equal to a length of a portion of flexible display screen 20 pushed out of the housing 10 by the second stretching member 32, and speeds of pulling out and pushing out are equal. Therefore, when the flexible display screen 20 is stretched outwards and retracted inward, it will not be greatly dragged, thereby forming a protective effect on the flexible display screen 20 and extending the lifespan of the flexible display screen 20.

The gear is movably installed in the transmission groove by the gear pin, and the first stretching member 31 and the second stretching member 32 are driven to move in opposite directions through the rotation of gear. In order to make movable distances of the first stretching member 31 and the second stretching member 32 as long as possible, the transmission groove is provided in a middle position on the inner wall of the first side plate 122, which means that the gear is positioned in a middle position of the flexible display device. A module of the gear ranges from 0.25 millimeters to 5 millimeters.

The first gear rack is disposed on the bottom surface of the first support member 110. The second gear rack is disposed on the top surface of the second support member 120. The gear in the transmission assembly 33 rotate to drive the gear racks to move. There are many ways to arrange the first gear rack, the second gear rack, and the transmission assembly 33.

In an embodiment, an entire surface of the first gear rack is disposed on the bottom surface of the first support member 110. An entire surface of the second gear rack is disposed on the top surface of the second support member 120. The gear pin penetrates through two opposite ends of the gear and is movably installed in the transmission grooves on the two first side plates 122 respectively. A width of the gear is less than or equal to a distance between the two first side plates 122.

In an embodiment, the bottom surface of the first support member 110 is provided with two first gear racks parallel to each other. The two first racks are respectively adjacent to the two first side plates 122. The top surface of the second support member 120 is provided with two second gear racks parallel to each other. The two second gear racks are respectively adjacent to the two first side plates 122 and correspond to the two first gear racks 310. The transmission assembly 33 includes a first transmission assembly and a second transmission assembly, which are separated from each other. The gear pin in the first transmission assembly is movably installed in the transmission groove on one first side plate 122. The gear pin in the second transmission assembly is movably installed in the transmission groove on another first side plate 122. The gear in the first transmission assembly meshes with the first gear rack and the second gear rack adjacent to one first side plate 122. The gear in the second transmission assembly meshes with the first gear rack and the second gear rack adjacent to another first side plate 122.

In this embodiment, the flexible display screen 20 can be switched between the first state and the second state through fitting the gear, the gear pin, the first gear rack, and the second gear rack. An entire stretching mechanism 30 has a simple structure and does not require too much complicated design. Therefore, the space occupied by the flexible display device is small, which further makes the flexible display device have a smaller overall volume and more convenient to be carried.

It should be explained that the structure of the stretching mechanism 30 is not limited to the above two embodiments. Other stretching mechanisms that can switch the flexible display screen 20 between the first state and the second state fall within a protection scope of embodiments of the present application.

The first end 21 of the flexible display screen 20 can be fixed to the upper surface of the first support member 110 by a first adhesive layer. Material of the first adhesive layer can be an optical adhesive. The second end 22 of the flexible display screen 20 can be fixed to the upper or lower surface of the second stretching member 32 by a second adhesive layer or a clamping member. Material of the second adhesive layer can be an optical adhesive. The clamping member can be a splint.

In an embodiment, the flexible display device further includes a guide member 50. Two ends of the guide member 50 are mounted on the inner walls of the two second side plates 112. The guide member 50 is configured to provide direction guidance during the sliding process of the flexible display screen 20, so that the flexible display screen 20 slides more smoothly. The guide member 50 can be fixedly installed or movably installed on the inner walls of the two second side plates 112. In this embodiment, the guide member 50 is movably installed.

Because the first support member 110 and the second tensile member 32 are fixed on a plane of the flexible display screen 20, in order to prevent the second packaging portion 42 of the flexible display screen 20 from being perpendicular to edges of the first support member 110 and the second stretching member 32 to be scratched, the guide member 50 is provided on one side of the first support member 110. The flexible display screen 20 sequentially bypasses the second support member 120 and the guide member 50, so that the first end 21 and the second end 22 of the flexible display screen 20 can be smoothly transferred.

In an embodiment, the guide member 50 is a roller. Two end surfaces of the roller are movably installed on the inner walls of the two first side plates 122. Specifically, either the inner walls of the two first side plates 122 or the two end surfaces of the roller are provided with a circular protrusion, while the other are defined with a circular groove 51. The circular protrusion is embedded in the circular groove 51. As shown in FIG. 1, circular protrusions are provided on the inner walls of the two first side plates 122, circular grooves 51 are defined on two opposite end surfaces of the roller, and the two circular protrusions are clamped in the two circular grooves 51. It is also possible to defined circular grooves 51 on the inner walls of the two first side plates 122, provide circular protrusions on the two opposite end surfaces of the roller, and clamp the two circular protrusions in the two circular grooves 51. Both these configurations are possible. Centers of the circular protrusion and the circular groove 51 are on an axis of the roller, so the roller can rotate around its own axis. When the flexible display screen 20 is pulled out of and retracted into the housing 10, the roller can rotate with a moving direction of the flexible display screen 20, so that the flexible display screen 20 has less resistance when it stretches and is easier to be pulled. The bottom surface of the flexible display screen 20 will not produce too much friction, which extends the lifespan of the flexible display device.

The first end 21 of the flexible display screen 20 is fixed to the upper surface of the first support member 110. The second end 22 of the flexible display screen 20 is fixed to the second stretching member 32. When the flexible display screen 20 is gradually pulled out of the housing 10, the flexible display screen 20 has a portion between the first support member 110 and the guide member 50 in addition to a portion wound on the guide member 50. Therefore, the second support member 120 needs to be provided to support the portion of the second packaging portion 42, so that a display surface of the flexible display screen 20 is relatively flat. In addition, when the flexible display screen 20 has a touch function, a support function of the second support member 120 can also ensure normal use of the touch function and prevent the flexible display screen 20 from being damaged by pokes during touching.

In order to ensure that the portion of the flexible display screen 20 outside the housing 10 can be supported during a stretching process, of the first support member 110 and the second support member 123, an upper surface of one is defined with a plurality of grooves 601 arranged at intervals, while a surface of the other one is provided with a plurality of comb teeth 602 arranged at intervals. A length direction of the grooves 601 is same as the stretching direction. Each of the comb teeth 602 is correspondingly embedded in each of the grooves 601.

This embodiment takes the first support member 110 defined with grooves 601 and the second support member 120 provided with comb teeth 602 as an example. When the flexible display screen 20 is pulled out of the housing 10 with a movement of the first support member 110, because the second support member 120 is fixed to the two first side plates 122 and remains stationary, the comb teeth 602 gradually move away from the grooves 601 with sliding of the first support member 110, and a length of each of the comb teeth 602 correspondingly embedded in each of the grooves 601 is gradually shortened. When the flexible display screen 20 is retracted into the housing 10 with the sliding of the first support member 110, the comb teeth 602 gradually slide in a direction approaching the grooves 601 with the movement of the first support member 110, and the length of each of the comb teeth 602 correspondingly embedded in each of the grooves 601 is gradually increased. Therefore, during the movement of the first support member 110, the first support member 110 and the second support member 120 always have an overlapping area, so that the portion of the flexible display screen 20 outside the housing 10 is supported at any position.

In an embodiment, a length of each of the comb teeth 602 is less than or equal to a length of each of the grooves 601. In this way, when the display area of the first support member 110 slides to the flexible display screen 20 is the initial display area, the comb teeth 602 are completely embedded in the grooves 601 in their length direction. The first support member 110 and the second support member 120 fit each other without a large gap between the two. All parts are supported when the flexible display screen 20 is touched, so a touch effect is increased. In addition, the length direction of the grooves 601 can provide a limit to the stretching direction, so that the flexible display screen 20 endures a uniform force during the stretching process.

Figure 12:
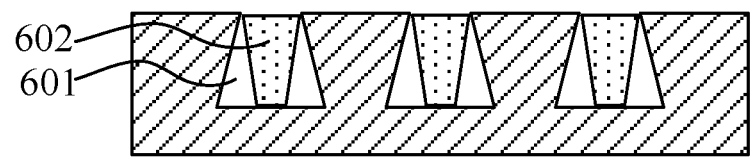
FIG. 12 is a cross-sectional schematic diagram of grooves of a first stretching member and comb teeth of a support member, which fit each other in the flexible display device provided by an embodiment of the present application.
Figure 13:
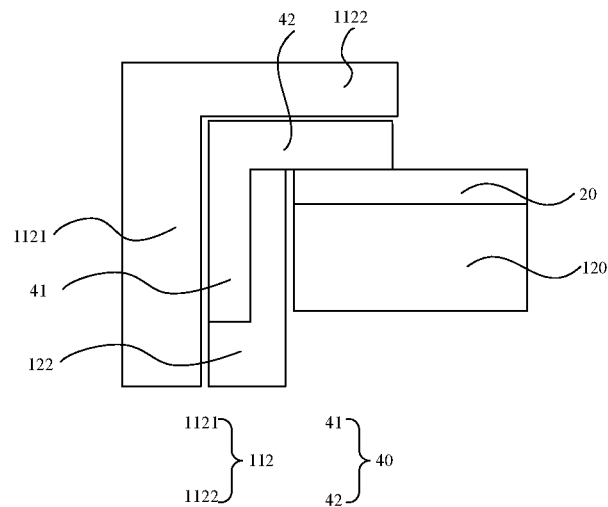
FIGS. 13-34 are respectively a first to a twenty-second cross-sectional schematic diagrams of structures at C in FIG. 8.

In an embodiment, as shown in FIG. 12, a cross-section of each of the grooves 601 includes an inverted trapezoid, and a cross-section of each of the comb teeth includes a regular trapezoid. A height of a top surface of each of the comb teeth 602 is less than or equal to a height of a top opening of each of the grooves 601. The cross-section of each of the grooves 601 is an inverted trapezoid, which means that each of the grooves 601 is a dovetail groove. An area of a bottom surface of each of the grooves 601 is greater than an area of the top opening thereof. The top surface of each of the comb teeth 602 is positioned below or flush with the opening of each of the grooves 601, so the top opening of each of the grooves 601 can provide a limit in an up and down direction when each of the comb teeth 602 is embedded in each of the grooves 601. An entire comb teeth 602 cannot penetrate through the openings of the grooves 601, so that the comb teeth 602 of the second support member 120 can be prevented from lifting upward and scratching the flexible display screen 20.

It can be known from the above-mentioned embodiments:

The flexible display device provided by the present application includes the housing, the flexible display screen, the stretching mechanism, and the packaging member. The housing includes the first housing and the second housing, which are relatively slidably arranged. The first housing includes the first support member. The second housing includes the second support member. The first end of the flexible display screen is connected to the first support member. The stretching mechanism is disposed in the housing. The second end of the flexible display screen bypasses the second support member and is connected to the stretching mechanism. The packaging member is disposed on at least one first side plate of the second housing. The first packaging surface of the packaging member covers at least a portion of the edge of the flexible display screen. When the flexible display screen is in the first state, the first housing and the second housing slide in directions away from each other, and the stretching mechanism pulls at least a portion of the flexible display screen out of the housing. When the flexible display screen is in the second state, the first housing and the second housing slide in directions approaching each other, and the stretching mechanism retracts at least a portion of the flexible display screen into the housing. In the present application, when the flexible display screen is pulled out and retracted into the housing, the packaging member packages a gap between the second support member and the flexible display screen, which prevents the edge of the flexible display screen from being lifted or prevents dust particles from intruding into the bottom of the flexible display screen, thereby extending a lifespan of the flexible display device.

In the above embodiments, the descriptions of the various embodiments are different in emphases, for contents not described in detail, please refer to related description of other embodiments.

The flexible display device provided by embodiments of the present application are described in detail above, and the description of embodiments above is only for helping to understand technical solutions of the present application and its core idea. Understandably, for a person of ordinary skill in the art can make various modifications of the technical solutions of the embodiments of the present application above. However, it does not depart from the scope of the technical solutions of the embodiments of the present application.

What is claimed is:

1. A flexible display device comprising:
a flexible display screen,
a housing configured to accommodate the flexible display screen, the housing comprising a first housing and a second housing slidably connected to each other, and
a packaging member disposed on at least one first side plate of the second housing, the packaging member comprising a first packaging portion and a second packaging portion connected to each other,
wherein a notch is formed at an intersection of an outer wall and a top surface of the first side plate, the first packaging portion is disposed in the notch, and the second packaging portion is disposed on the top surface of the first side plate.

2. The flexible display device according to claim 1, wherein a thickness of the first packaging portion is equal to a depth of the notch.

3. The flexible display device according to claim 1, wherein the second packaging portion overlaps at least a portion of an edge of the flexible display screen.

4. The flexible display device according to claim 3, wherein the second packaging portion comprises a first packaging surface close to the top surface of the first side plate and a second packaging surface opposite to the first packaging surface, and the first packaging surface is in contact with the flexible display screen to seal a gap between the first side plate and the flexible display screen.

5. The flexible display device according to claim 4, wherein a second side plate of the first housing comprises a side plate body and a first extension portion connected to each other, the side plate body is parallel to the first side plate, the first extension portion covers the packaging member and comprises a first extension surface facing the packaging member, and the first extension surface is fitted to the second packaging surface of the packaging member.

6. The flexible display device according to claim 5, wherein one of the first extension surface and the second packaging surface is formed with one or more protrusions, another of the first extension surface and the second packaging surface is formed with one or more grooves, and the protrusions and the grooves are fitted to each other.

7. The flexible display device according to claim 6, wherein a shape of the protrusions comprises at least one of a semicircular, a triangular, or a rectangular shape.

8. The flexible display device according to claim 5, further comprising a first blocking member disposed between the first extension surface and the second packaging surface.

9. The flexible display device according to claim 8, wherein the first blocking member comprises a brush or a foam.

10. The flexible display device according to claim 8, wherein the second side plate further comprises a second extension portion connected to and perpendicular to the first extension portion, and the side plate body, the first extension portion and the second extension portion form an accommodation cavity in which the packaging member and the first blocking member are embedded.

11. The flexible display device according to claim 10, wherein the second extension portion comprises a second extension surface adjacent to the flexible display screen, and a distance between the second extension surface and an upper surface of the flexible display screen is less than or equal to 0.5 millimeters.

12. The flexible display device according to claim 11, further comprising a second blocking member disposed between the second extension surface and the upper surface of the flexible display screen.

13. The flexible display device according to claim 5, wherein the second side plate further comprises a second extension portion connected to and perpendicular to the first extension portion, and the side plate body, the first extension portion and the second extension portion form an accommodation cavity in which the packaging member is embedded.

14. The flexible display device according to claim 13, wherein the second extension portion comprises a second extension surface adjacent to the flexible display screen, and a distance between the second extension surface and an upper surface of the flexible display screen is less than or equal to 0.5 millimeters.

15. The flexible display device according to claim 14, further comprising a second blocking member disposed between the second extension surface and the upper surface of the flexible display screen.

16. The flexible display device according to claim 1, wherein the first housing comprises a first bottom plate, the second housing comprises a second bottom plate, both of the first bottom plate and the second bottom plate are located below the flexible display screen, and a distance between the first bottom plate and the second bottom plate is less than 1.5 millimeters.

17. The flexible display device according to claim 16, wherein the distance between the first bottom plate and the second bottom plate is less than or equal to 0.5 millimeters.

* * * * *